United States Patent [19]
Yamamoto et al.

[11] Patent Number: 4,797,346
[45] Date of Patent: Jan. 10, 1989

[54] LIGHT-SENSITIVE COMPOSITION FOR POSITIVE-TYPE LIGHT-SENSITIVE LITHOGRAPHIC PRINTING PLATES

[75] Inventors: Takeshi Yamamoto, Mitaka; Nobumasa Sasa, Sayama; Miegi Nakano, Chofu, all of Japan

[73] Assignee: Konishiroku Photo Industry Co., Ltd., Tokyo, Japan

[21] Appl. No.: 51,224

[22] Filed: May 13, 1987

Related U.S. Application Data

[63] Continuation of Ser. No. 884,206, Jul. 10, 1986, abandoned, which is a continuation of Ser. No. 743,775, Jun. 12, 1985, abandoned.

[30] Foreign Application Priority Data

Jun. 20, 1984 [JP] Japan .................................. 59-127187

[51] Int. Cl.⁴ ............................ G03C 1/60; G03F 7/08
[52] U.S. Cl. ..................................... 430/192; 430/165; 430/166; 430/191; 430/302; 430/326
[58] Field of Search ............... 430/192, 165, 166, 302, 430/326, 191

[56] References Cited

U.S. PATENT DOCUMENTS

| | | | |
|---|---|---|---|
| 3,666,473 | 5/1972 | Colom et al. | 430/326 |
| 4,123,279 | 10/1978 | Kobayashi | 430/192 |
| 4,377,631 | 3/1983 | Toukhy et al. | 430/192 |
| 4,404,357 | 9/1983 | Taylor et al. | 528/155 |
| 4,424,315 | 1/1984 | Taylor et al. | 528/153 |
| 4,442,195 | 4/1984 | Yamamoto et al. | 430/192 |
| 4,551,409 | 11/1985 | Gulla et al. | 430/197 |

FOREIGN PATENT DOCUMENTS

| | | | |
|---|---|---|---|
| 160783 | 10/1975 | Czechoslovakia | 430/192 |
| 2616992 | 11/1977 | Fed. Rep. of Germany | 430/192 |

*Primary Examiner*—Charles L. Bowers, Jr.
*Attorney, Agent, or Firm*—Finnegan, Henderson, Farabow, Garrett, & Dunner

[57] ABSTRACT

A light-sensitive composition for use in the preparation of positive-type light-sensitive lithographic printing plate which comprises an o-naphthoquinone diazide compound and novolak resin in which the novolak resin comprises two different novolak resins each being prepared by the polycondensation or co-polycondensation of an aldehyde with at least one compound selected from the group consisting of phenol, m-cresol, o-cresol, and p-cresol.

8 Claims, 1 Drawing Sheet

LIGHT-SENSITIVE COMPOSITION FOR POSITIVE-TYPE LIGHT-SENSITIVE LITHOGRAPHIC PRINTING PLATES

This application is a continuation, of application Ser. No. 884,206, filed July 10, 1986, abandoned which was a continuation application of application Ser. No. 743,775, filed June 12, 1985 and now abandoned.

FIELD OF THE INVENTION

The present invention relates to a light-sensitive composition for use in the preparation of positive-type light-sensitive lithographic printing plates, and more particularly to a light-sensitive composition which contains an o-naphthoquinonediazide compound and novolak resin and which is excellent in the safety-to-light characteristics, developability and processing chemical-resistant characteristic.

BACKGROUND OF THE INVENTION

In general, compositions for use in the preparation of positive-type light-sensitive lithographic printing plates are those containing an o-quinonediazide compound as a light-sensitive constituent and an alkali-soluble resin for increaseing the strength of the coat layer on the plate.

Novolak resins such as phenol-formaldehyde resin, cresol-formaldehyde resin, etc., have conventionally been used as the alkali-soluble resin. West German OLS Patent No. 2,616,992 describes the use of a novolak resin, as a binder, obtained by the polycondensation of a phenol substituted by an alkyl group having from 1 to 9 carbon atoms and formaldehyde to improve the printing plate on the resistance thereof against alkaline developer and on the wear resistance of the light-sensitive layer thereof. Further, Japanese Patent Publication Open to Public Inspection (hereinafter referred to as Japanese Patent O.P.I. Publication) No. 127553/1980 describes the use of a copolycondensed novolak resin, as a binder, obtained by the condensation of at least one alkyl-phenol and phenol or a methyl-substituted phenol or a mixture of these and formaldehyde to improve the resistance against an alkaline developer like above.

The above two resins, however, are poor in the alkali-solubility. A lithographic printing plate that uses a lightsensitive composition containing these resins as binder materials has the disadvantage tht its alkali-solubility at the time of its development is bad; not satisfactorily developed when processed in an exhausted alkaline developer solution; and thus the sensitivity of the printing plate becomes deteriorated.

Japanese Patent O.P.I. Publication No. 57841/1980 describes an alkali-solubility-improved novolak resin obtained by the co-polycondensation of phenol and cresol with an aldehyde. However, the resin, although satisfactory in the alkali-solubility, is not necessarily sufficient in the resistance to processing chemicals. A positive-type light-sensitive lithographic printing plate, when it undergoes a plate-making treatment under a white fluorescent lamp light, produces a fog to cause a loss of the light-sensitive layer in the image area during its development process, thus leading to deterioration of the printing plate's press life (such characteristics are hereinafter called "safety-to-light characteristics"). The use of the above-described co-polycondensed resins is disadvantageous in that it increases such deterioration of the press life due to fog. The foregoing co-polycondensed resins, if their weight average molecular weight exceeds 6000, will improve the printing plate's processing chemical-resistant characteristic, but on the other hand there occurs a contradiction that their alkali-solubility and sensitivity become deteriorated at the same time.

Further, Japanese Patent Examined Publication No. 23570/1979 describes the improvement of the printing plate on the sensitivity thereof by use of two types of phenol-formaldehyde novolak resins or resol resins different in the solubility to an aqueous alkaline solution having a pH of not more than 12 as the binder resin to be contained in a photoresist composition. However, since a developer solution for use in processing the positive-type light-sensitive lithographic printing plate has a high alkalinity (pH approximately 13), in the case where the foregoing two types of resins are used as the binder for the light-sensitive composition of the positive-type light-sensitive lithographic printing plate, the sensitivity of the plate can be improved, but there occurs an extreme corrosion in the unexposed image portion of the light-sensitive layer by an alkaline developer liquid used for its development, resulting in the deterioration of the ink receptivity, processing chemical-resistant characteristic, and safety-to-light characteristics of the printing plate.

Japanese Patent O.P.I. Publication Nos. 101833/1982 and 101834/1982 describe a method for improving the processing chemical-resistant characteristic, alkali-solubility, and press life of the printing plate by use of a polyhydric phenolbenzaldehyde condensate such as resorcinol-benzaldehyde resin, pyrogallol-benzaldehyde resin, etc.; a polyhydric phenol-acetone co-polycondensate resin such as pyrogallol-resorcinol-acetone resin, etc.; and the like, as the binder for the light-sensitive composition of a positive-type light-sensitive lithographic printing plate. This method, however, is disadvantageous with respect to the safety-to-light characteristics.

SUMMARY OF THE INVENTION

It is therefore an object of the present invention to provide a light-sensitive composition for positive-type light-sensitive lithographic printing plates which is improved on the processing chemical-resistant characteristic, safety-to-light characteristics, and ink receptivity thereof without any deterioration of the alkali-solubility and sensitivity of the positive-type light-sensitive lithographic printing plate.

The above object of this invention is accomplished by the following light-sensitive composition: In a light-sensitive composition for positive-type light-sensitive lithographic printing plates comprising an o-quinonediazide compound and a novolak resin, the light-sensitive composition in which the above novolak resin comprises at least two different novolak resins, each being obtained by the polycondensation or co-polycondensation of an aldehyde with at least one compound selected from the group consisting of phenol, m-cresol, o-cresol and p-cresol, and the ratios in terms of the mole percentages of the respective sums of the quantities of the phenol, the quantities of the m-cresol (and/or the o-cresol) and the quantities of the p-cresol, which are constituents for the polycondensation or co-polycondensation of all the novolak resins contained in the light-sensitive composition, to the total quantities of all the constituents are from 5 to 75 mole % for the phenol, from 20 to 70 mole % for the m-cresol (and/or the o-cresol) and from 5 to 75 mole % for the p-cresol.

BRIEF DESCRIPTION OF THE DRAWING

In FIG. 1, each vertex of the triangle is a place where any one of phenol, m-cresol (or o-cresol) and p-cresol accounts for 100% with no presence of the other two constituents. As the point moves away from the vertex toward the opposite side, the constituent percentage represented by it gets smaller and finally becomes zero % when it reaches the opposite side. The points A through H in FIG. 1 are indicated by the coordinates of the three constituents, and the coordinates of (phe, p, m/o) indicate the ratio (mole %) of phenol, the ratio (mole %) of p-cresol, and the ratio (mole %) of m-cresol or o-cresol.

DETAILED DESCRIPTION OF THE INVENTION

Figure 1:
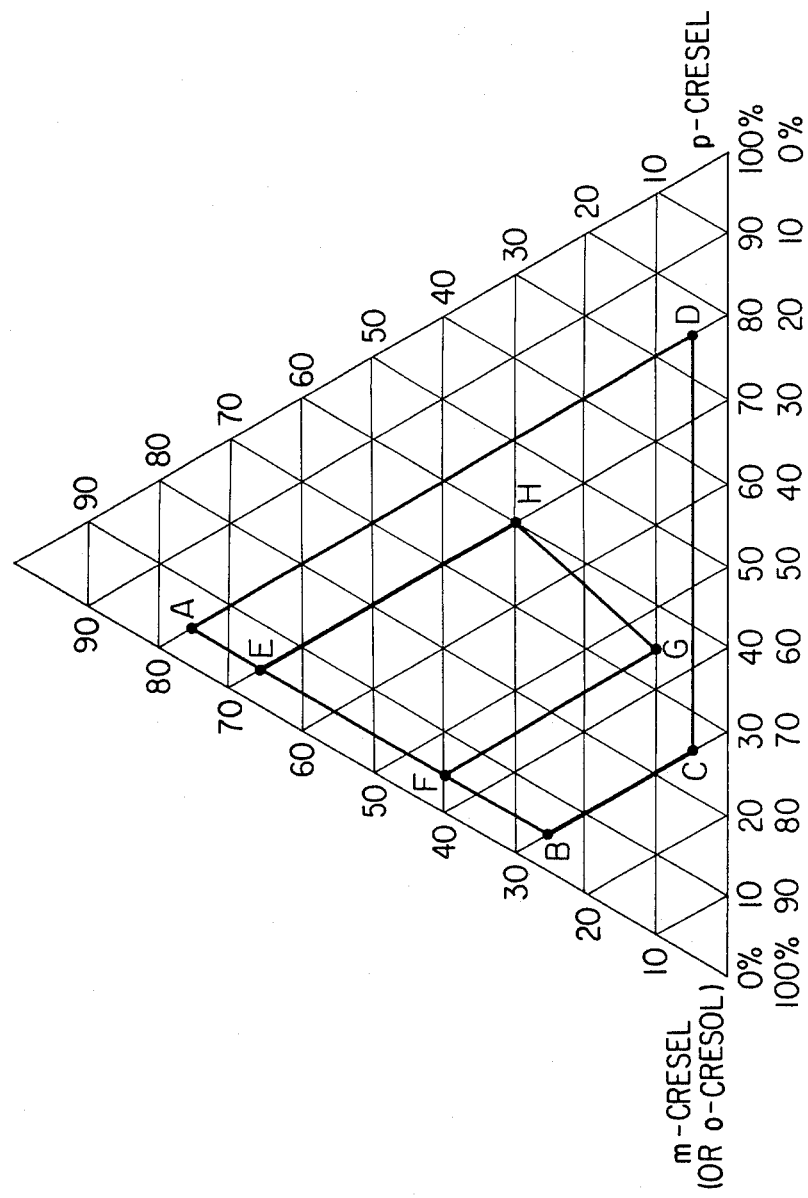
FIG. 1 is a graph showing with ternary coordinates the respective mole percentages of the three constituents: phenol, m-cresol (or o-cresol) and p-cresol.

The novolak resin of this invention is one that is obtained by the co-polycondensation of at least one selected from the group consisting of phenol, m-cresol (or o-cresol) and p-cresol with an aldehyde in the presence of an acid catalyst. The aldehyde includes aliphatic and aromatic aldehydes such as formaldehyde, acetaldehyde, benzaldehyde, acrolein, furfural, and the like. Of these, formaldehyde is desirable.

Examples of the novolak resin of the present invention include phenol-formaldehyde resin, m-cresol-formaldehyde resin, o-cresol-formaldehyde resin, phenol-m-cresol-formaldehyde copolycondensate resin, phenol-p-cresol-formaldehyde co-polycondensate resin, m-cresol-p-cresol-formaldehyde co-polycondensate resin, o-cresol-p-cresol-formaldehyde co-polycondensate resin, phenol-m-cresol-p-cresol-formaldehyde co-polycondensate resin, phenol-o-cresol-p-cresol-formaldehyde co-polycondensate resin, and the like. The above polycondensate or co-polycondensate resins can be obtained by ordinary methods.

The light-sensitive composition of the present invention comprises two or more resins, and preferably two resins, different in the characteristics, of the above-mentioned novolak resins. The combined resins as a whole contain phenol and p-cresol, each accounting for at least 5% thereof in the mole percentage used in the preparation for the synthesis of the resins. The preferred combination is a combination of phenol-m-cresol-p-cresol-formaldehyde co-polycondensate resins different in the characteristics or a combination of phenol-m-cresol-p-cresol-formaldehyde co-polycondensate resin with m-cresol-p-cresol-formaldehyde co-polycondensate resin, wherein the "characteristics" are the molecular weight, composition ratio of each component monomer, etc., of such resins.

As for the molecular weight (polystyrene standard) of the above novolak resin, preferably number average molecular weight Mn is from $3.00 \times 10^2$ to $5.00 \times 10^3$ and weight average molecular weight Mw is from $1.00 \times 10^3$ to $2.00 \times 10^4$, and more preferably Mn is from $1.00 \times 10^3$ to $3.00 \times 10^3$ and Mw is from $6.00 \times 10^3$ to $1.50 \times 10^4$.

Determination of the molecular weight of the resin is to be made by G.P.C. (Gel Permeation Chromatography method). The calculation of number average molecular weight Mn and weight average molecular weight Mw is to be made by the method of levelling the peak in the oligomer region (by connecting between the peak point and the center of the dale) as described by Morio Tsuge et al in the Journal of the Chemical Society of Japan, pp. 800–805 (1972).

The above novolak resin content of the whole composition in the light-sensitive layer is preferably from 30 to 95% by weight, and more preferably from 50 to 85% by weight.

Further, in the present invention, the sum of all the phenol, m-cresol (or o-cresol) and p-cresol used in the copolycondensation of the above novolak resin means, in the case where two or more types of the above novolak resin are used in combination, the total amount of all the phenol, m-cresol (or o-cresol) and p-cresol used in the synthesis of the respective novolak resins to be used in combination; that is, the amount of the phenol, m-cresol (or o-cresol) and p-cresol used in the synthesis of the combined resins regarded as a single resin. The quantity ratio of the three constituents, represented in terms of molar ratio, is present within the region formed by the trapezium with its vertexes A, B, C and D in FIG. 1 (the line portion of Trapezium ABCD inclusive). This molar ratio is calculated from the percentages by weight of the respective resin contents to be combined and the molar ratio between the phenol, m-cresol (or o-cresol) and p-cresol used in the synthesis of the respective resins. This molar ratio is preferably present within the region surrounded by the trapezium with its vertexes E, F, G and H (the line portion of Trapezium EFGH inclusive).

In FIG. 1, the coordinates of Points A through H (ratio (mole %) of phenol, ratio (mole %) of p-cresol, and ratio (mole of m-cresol or o-cresol) are as follows:

Point A (75%, 5%, 20%)
Point B (25%, 5%, 70%)
Point C (5%, 25%, 70%)
Point D (5%, 75%, 20%)
Point E (65%, 5%, 30%)
Point F (40%, 5%, 55%)
Point G (10%, 35%, 55%)
Point H (30%, 40%, 30%)

In the above novolak resin, the method of ascertaining the quantity ratio between the three constituents the phenol, m-cresol (or o-cresol) and p-cresol used in the sysnthesis thereof is pyrolysis gas chromatography (PGC). Regarding the pyrolysis gas chromatography, its principle and the device and experimental requirements therefor are described in, e.g., Shin Tsuge, the "Kobunshi Kagaku [I](Polymer Chemistry [I])" pp. 474–485, Vol. 19 of the "Shin Jikken Kagaku Koza (Course of New Experimental Chemistry)" compiled by the Chemical Society of Japan (published by Maruzen Co., Ltd. 1978), and the qualitative analysis of novolak resins by pyrolysis gas chromatography may be made in accordance with the method as described in, Morio Tsuge, Takashi Tanaka and Shigeyuki Tanaka, "Bunseki Kagaku (Analytical Chemistry)" Vol. 18, pp.47-52 (1969).

The o-quinonediazide compound used in this invention is a compound having at least one o-naphthoquinonediazido group preferably o-benzoquinonediazido group or o-naphthoquinonediazido group, and includes known compounds of various structures such as those compounds as described in detail in, e.g., J. Kosar, the "Light-Sensitive Systems" (published by John Wiley & Sons, Inc. 1965) pp. 339–353. Particularly, those esters or amides of o-naphthoquinonediazidosulfonic acid with various hydroxy compounds or amino compounds are suitable. The preferred hydroxy compounds include condensate resins from phenols and carbonyl group-containing compounds, and especially those resins obtainable by the condensation in the presence of an acid catalyst. The phenols include phenol, resorcinol, cresol, pyrogallol, and the like. The carbonyl group-containing compounds include aldehydes such as formaldehyde, benzaldehyde, etc., and ketones such as acetone.

Particularly, phenol-formaldhhyde resin, cresol-formaldehyde resin, cresol-formaldehyde resin, pyrogallol-acetone resin, and resorcinol-benzaldehyde resin are preferred. And further pyrogallol-acetone resin is preferred.

Typical examples of the o-quinonediazide compound include esters of benzoquinone-(1, 2)-diazidosulfonic acid or naphthoquinone-(1,2)-diazidosulfonic acid with phenol-formaldehyde resins or cresol-formaldehyde resins; sulfonates of naphthoquinone-(1,2)-diazidosulfonic acid with pyrogallol-acetone resins as described in U.S. Pat. No.3,635,709; condensates of naphthoquinone-(1,2)-diazido-(2)-5-sulfonic acid with resorcinol-benzaldehyde resins as described in Japanese Patent O.P.I. Publication No.1044/1981; ester compounds of naphthoquinone-(1,2)-diazido-(2)-5-sulfonic acid with resorcinol-pyrogallol-acetone co-polycondensates as described in Japanese Patent O.P.I. Publication No. 76346/1980; other useful o-quinonediazide compounds as described in Japanese Patent O.P.I. Publication No. 117503/1975 include those esters of o-naphthoquinonediazidosulfonic acid with polyesters having a hydroxy group at the terminal thereof; esters of o-naphthoquinonediazidosulfonic acid with p-hydroxystyrene homopolymers or copolymers thereof with other copolymerizable monomers; and the like.

The o-quinonediazide compound content of the light-sensitive resist-forming composition is preferably from 5 to 60% by weight of the whole solid components of the composition, and most preferably from 10 to 50% by weight.

The light-sensitive composition of the present invention may, if necessary, contain additives other than the above-described materials, the additives including various low-molecular compounds as plasticizers such as, e.g., phthalates, triphenylphosphates, maleates; surface-active agents as coatability-improving agents such as nonionic surfactants typified by ethyl cellulose-polyalkylene ethers; acid anhydrides as sensitizers; and further, print-out materials used for the visible image formation by exposure. The print-out material is one comprising a compound producing an acid or free radical by exposure and an organic dye that changes its own color by the interaction with the above compound. The compound producing an acid or free radical by exposure includes, e.g., o-naphthoquinonediazido-4-sulfonic acid halogenide as described in Japanese Patent O.P.I. Publication No. 36209/1975; trihalomethyl-2-pyrone and trihalomehyl-tolidine as described in Japanese Patent O.P.I. Publication No. 36223/1978; o-naphthoquinonediazido-4-sulfonic acid chloride and phenols having an electron-attractive substituent or ester compounds with anilines as described in Japanese Patent O.P.I. Publication No. 6244/1980; halomethyl-vinyl-oxadiazole compounds and diazonium salts as described in Japanese Patent O.P.I. Publication No. 77742/1980; and the like.

The above-mentioned organic dye includes triphenyl-methane type, diphenyl-methane-type, oxazine-type, xanthene-type, iminonaphthoquinone-type, azomethine-type and anthraquinone-type dyes, typified by, e.g., Victoria Pure Blue BOH (Hodogaya Chemical Co., Ltd.), Oil Blue #603 (Orient Chemical Co., Ltd.), Patent Pure Blue (Sumitomo-Mikuni Chemical Co., Ltd.), crystal violet, brilliant green, ethyl violet, methyl green, erythrocin B, basic fuchsine, malachite green, oil red, m-cresol purple, rhodamine B, auramine, 4-p-diethylaminophenyliminonaphthoquinone, cyano-p-diethylaminophenyl-acetanilide, and the like.

Further, the light-sensitive composition, in order to improve the ink-receptivity, may contain a light-sensitive resin obtained by the condensation of an oleophilic phenol-formaldehyde resin and p-substituted phenol-formaldehyde resin with o-quinonediazidosulfonic acid chloride. The ink-receptivity-improving agent is desirable to be contained in a quantity of from 0.1 to 2% by weight of the whole composition of the light-sensitive layer.

The light-sensitive composition of this invention is dissolved in a solvent including cellosolves such as, e.g., methyl cellosolve, ethyl cellosolve, methyl cellosolve acetate, ethyl cellosolve acetate, etc., dimethyl formamide, dimethyl sulfoxide, dioxane, acetone, cyclohexane, trichloroethylene, methyl-ethyl ketone, and the like, or in a mixture or two or more of such solvents to thereby prepare a light-sensitive coating liquid, which is then coated on a support and then dried, whereby a positive-type light-sensitive lithographic printing plate can be formed. Materials usable as the above-mentioned support includes aluminum plates (preferably anodic oxidation-treated aluminum plates), zinc plates, copper plates; iron and steel plates plated with at least one selected from the group consisting of tin, chromium and nickel; metal plates plated with fused aluminum; iron-plated steel plates; those plates obtained by laminating aluminum foil directly or through an adhesion layer on the back of metal plates, plastic film, paper, etc.; and plastic film; and the like.

The most preferred are aluminum plates. The aluminum plate support is desirable to be subjected to graining treatment, desmut treatment, or anodic oxidation treatment, and, if necessary, such surface treatment as sealing treatment. These treatments may be carried out by known methods. The graining method includes mechanical methods such as brush abrasion method, ball abrasion method, etc.; chemical methods such as electrolytic etching method; and combination of mechanical and electrolytic methods; and the like.

The desmut treatment method includes the alkali etching method, sulfuric acid desmut method, etc. The anodic oxidation is carried out by applying an electric current to an aluminum plate as an anode placed in an aqueous solution or nonaqueous solution of single or a mixture of two or more of inorganic acids such as boric acid, sulfuric acid, etc., or organic acids such as oxalic acid, sulfamic acid, etc. Further, the sealing treatment is carried out by immersing an aluminum plate in an aqueous sodium silicate solution, heated water, or a heated aqueous inorganic or organic salt solution, or by placing it in a steam bath.

On the other hand, in the light-sensitive lithographic printing plates each of the invention comprising an aluminium-based support subjected to graining treatment and provided thereon with an anodic oxidation coat so that the quantity of the anodic oxidation coat may be within the range of from 25 mg/dm$^2$ to 50 mg/dm$^2$ and a photosensitive layer containing an o-quinone diazide compound and the novolak resin, the lithographic printing plates each using a light-sensitive composition of the invention of which the weight average molecular weight of the novolak resin is from 6.00×10$^3$ to 2.00×10$^4$ can display the excellent characteristics such as a high sensitivity, an excellent dot-loss effect, an excellent ball-point pen resistance, and the durability against a variety of processing chemicals used in course of printing works.

'Ball-point pen resistance' stated herein means as follows. There are some instances where the positions of plural film originals are marked respectively on a light-sensitive lithographic printing plate to align therewith when the plural film originals are laid out to be printed one after another on the lithographic printing plate, that is so-called 'multiple printing', and in this instance a ball-point pen is commonly used to serve as a marking means. The light-sensitive layer of the lithographic printing plate is eroded and then dissolved by the ink of the ball-point pen. If the marked position is in an image area and a development is carried out as it is, there may be some troubles where the portion of the light-sensitive layer covering the marks in the image area may be removed and the marks may be reproduced on a printed matter when printing. The expression, the 'ball-point pen resistance' means that a lithographic printing plate can hardly be eroded by the ink of a ball-point pen.

The above-mentioned lithographic printing plates are preferably used when the molecular weight of the novolak resin thereof is from 8×10$^2$ to 5×10$^3$ in number average molecular weight Mn and is from 6×10$^3$ to 2×10$^4$ in weight average molecular weight Mw, and they can display more preferable effects when the number average molecular weight Mn is from 1×10$^3$ to 3×10$^3$ and the weight average molecular weight Mw is from 8×10$^3$ to 1.5×10$^4$.

In the above-mentioned lithographic printing plates, the preferred o-quinonediazide compounds of the light-sensitive layer thereof are o-quinonediazide sulfonates which are the polycondensed resins of polyhydroxy phenol and ketone or aldehyde, of which number average molecular weight is from 3.00×10$^2$ to 2.00×10$^3$ and weight average molecular weight is from 5.00×10$^2$ to 4.00×10$^3$. The further preferred one is an o-naphthoquinonediazide sulfonate which is a polycondensed resin of pyrogallol and acetone of which number average molecular weight is 4.00×10$^2$ to 1.50×10$^3$ and weight average molecular weight is from 7.00×10$^2$ to 3.00×10$^3$.

The condensation degree of o-naphthoquinonediazide chloride to the OH radical of the phenol of the above-mentioned ester compounds, that is a percentage to an OH radical, is preferably from 20% to 80%, more preferably from 25% to 70%, and still more preferably from 30% to 60%.

In a preparation method of the above-mentioned lithographic printing plates, a support comprising an aluminium-based material is subjected to graining treatment and then to an anodic oxidation treatment as previously described.

When an electrolysis is carried out by making use of a solution containing sulfuric acid. chromic acid, oxalic acid. phosphoric acid malonic acid, or the like independently or in combination as an electrolytic solution and aluminium as an anode, an anodic oxidation coat is formed on the aluminium surface. The suitable conditions of the electrolysis are within the ranges of from 5 to 85% by weight in acid concentration, from 1 to 60 A/dm$^2$ in current density and from 0° to 80° C. at bath temperature. The methods are given as the examples in which the above-mentioned printing plates are prepared under the conditions that the bath temperature is from 10° C. to 30° C. the voltage is from 15 V to 20 V, the current density is from 1 A/dm$^2$ to 2 A/dm$^2$ and the processing time is from 2 minutes to 10 minutes in an aqueous sulfuric acid solution of from 10% by weight to 20% by weight in concentration, or the bath temperature is from 20° C. to 70° C., the voltage is from 20 V to 50 V, the current density is from 1 A/dmZ to 2 A/dmZ, and the processing time is from 0.5 minutes to 10 minutes in an aqueous phosphoric acid solution of from 1% by weight to 30% by weight in concentration. The anodic oxidation coated amount of such plates formed in the methods is from 25 mg/dm$^2$ to 50 mg/dm2.

The thus obtained lithographic plate material is used in known manner: The plate is exposed through a positive image film closely contacted therewith to the light of an ultrahigh-voltage mercury arc lamp, metal halide lamp, or the like, and then processed in an alkaline developer liquid, and thereafter used as a printing plate.

The alkaline developer liquid is an aqueous solution containing sodium hydroxide, potassium hydroxide, sodium carbonate, sodium silicate, sodium metasilicate, potassium metasilicate, sodium secondary phosphate, sodium tertiary phosphate, or the like. The concentration of the alkaline agent is preferably from 0.1 to 10% by weight.

EXAMPLES

The present invention will be illustrated by the following examples, but is not limited thereto.

EXAMPLE 1

A 0.24 mm-thick aluminum plate (material 1050, temper H16) was degreased in an aqueous 5% sodium hydroxide solution kept at 60° C. for one minute, and then subjected to an electrolytic etching treatment for 30 seconds in one liter of 0.5 mol aqueous hydrochloric acid solution kept at 25° C. under the condition of a current density of 60 A/dm$^2$. After that, the plate underwent a 10-second desmut treatment in an aqueous 5% sodium hydroxide solution at 60° C., and then a one-minute anodic oxidation treatment in an aqueous 20% sulfuric acid solution at 20° C. under the condition of a current density of 3 A/dm2. Further, the plate was subjected to a 20-second sealing treatment in a heated water at 80° C., thus preparing an aluminum plate support for a lithographic printing plate material.

On the resulting aluminum plate was coated a light-sensitive coating liquid having the following composition by means of a rotary coating machine, and then it was dried at 100° C. for 4 minutes, whereby a positive-type light-sensitive lithographic printing plate was obtained.

LIGHT-SENSITIVE COATING LIQUID COMPOSITION

| | |
|---|---|
| An ester compound of naphthoquinone-(1,2)-diazido-(2)-5-sulfonic acid chloride with pyrogallol-acetone resin (described in Example 1 in the specification of U.S. Pat. No. 3,635,709; condensation rate: 33 mole %). | 1.7 g |
| Phenol-m-cresol-p-cresol-formaldehyde co-polycon- | 4.42 g |

-continued

| | |
|---|---|
| densate resin (molar ratio of phenol, m-cresol and p-cresol is 20:48:32, number average molecular weight Mn = 1360, weight average molecular weight Mw = 9140, product name: SK-102, manufactured by Sumitomo Durez). | |
| Phenol-m-cresol-p-cresol-formaldehyde co-polycondensate resin (molar ratio of phenol, m-cresol, and p-cresol is 50:30:20, Mn = 1200, Mw = 9410, product name: SK-105, manufactured by Sumitomo Durez). | 2.08 g |
| An ester compound of a novolak resin synthesized from p-t-butylphenol and benzaldehyde and naphthoquinone-(1,2)-diazido-(2)-5-sulfonic acid chloride (condensation rate: 50 mole %). | 0.16 g |
| Oil Blue #603 (a product of Oriental) | 0.07 g |
| Methyl Cellosolve | 100 g |

The coated weight after drying was 22 mg/dm².

The molecular weights of the above two novolak resins were determined through the procedure of G.P.C. (gel permeation chromatography). The G.P.C. measuring condition used is as follows:
Instrument: Column type 635 (manufactured by Hitachi, Ltd.) Shodex A 802, A803 and A 804, connected in series (manufactured by Showa Denko K.K.)
Temperature: Room temperature
Solvent: Tetrahydrofuran
Flow rate: 1.5 ml/min.
Calibration curves were prepared with styrene as standard.

The thus obtained positive-type light-sensitive lithographic printing plate was exposed for 70 seconds through a sensitivity-testing step tablet (No. 2, manufactured by Eastman Kodak Company) and a positive image film, both being closely superposed thereon, to the light of a 2 KW metal halide lamp (Idolfin 2000, manufactured by Iwasaki Electric Co., Ltd.), located one meter from the printing plate. The exposed plate was then processed for 45 seconds in an aqueous 4% sodium silicate solution at 25° C., whereby a nonimage area-completely-removed lithographic printing plate was obtained. When the sensitivity of the obtained positive-type light-sensitive lithographic printing plate was measured, it was found that, in the gray scale (21 steps with each density step differential of 0.15), the step 4½ was completely developed (cleared).

Subsequently, in order to investigate the processing chemical-resistant characteristic, an Ultraplate Cleaner (manufactured by A. B. C. Chemical Co., Ltd.) was used which is to be used as a cleaner to remove the scum appearing in the non-image area during printing, and the durability of the plate against the chemical was tested.

The printing plate, bearing an image having density differential on the steps of the foregoing gray scale, was immersed for 45 minutes in the undiluted Ultraplate Cleaner liquid at room temperature, and then washed, and was compared with the image area before being immersed, and thus the corrosion degree on the image area by the chemical was judged. As a result, a satisfactory processing chemical-resistant characteristic was obtained with the results showing that no corrosion appeared on the image area of the plate, and the halftone was preserved up to the 3% area dots.

Next, the safety-to-light characteristics of the above positive-type light-sensitive lithographic printing plate was tested.

The lithographic printing plate, before being imagewise exposed and processed, was exposed for 10 minutes, being placed under a fluorescent lamp light (310 luxes) to let it be fogged, and then processed in the same manner as above, and the loss degree of the light-sensitive layer was measured. The loss degree of the layer is the reduction degree of the thickness of the layer; i.e., the difference between the thickness of the light-sensitive layer of the lithographic printing plate processed without being fogged by light and that of the same printing plate processed after being fogged. The larger the difference value, the worse the safety-to-light characteristics.

As a result, the layer's loss degree was 5%. Further, in order to test the press life, the above-obtained lithographic printing plate was imagewise exposed through a positive image film contacted therewith in the same was as the above, then fogged by a white fluorescent lamp light in like manner, and then processed likewise to thereby obtain a lithographic printing plate A. On the other hand, another printing plate B was prepared in the same manner except that it was not fogged. Both lithographic printing plates A and B were juxtaposedly set to an offset printing machine to perform printing. As a result, both the printing plates showed satisfactory ink receptivity with a spoilage of only twelve prints. As for the press life, the lithographic printing plate A exhibited acceptable press run of 180,000 impressions, while the printing plate B exhibited 200,000 impressions, and thus the deterioration of the press life due to the fog by light was 10%. Judgement on the expiration of the press life was made at the point where the solid portion of the image area is peeled to make the plate unable to continue its printing.

COMPARATIVE EXAMPLE 1

On an aluminum plate support similar to that of Example 1 was coated in like manner the following light-sensitive coating liquid, and then dried, whereby a positive-type light-sensitive lithographic printing plate was obtained.

LIGHT-SENSITIVE COATING LIQUID COMPOSITION

| | |
|---|---|
| An ester compound of naphthoquinone-(1,2)-diazido-(2)-5-sulfonic acid chloride with pyrogallol-acetone resin (as described in Example 1 of the specification of U.S. Pat. No. 3,635,709, condensation degree is 33 mole %). | 1.7 g |
| phenol-m-cresol-p-cresol-formaldehyde co-polycondensate resin (molar ratio of phenol, m-cresol and p-cresol is 30:42:28, number average molecular weight Mn = 1400, weight average molecular weight Mw = 9800, determined in the same manner as in Example 1, product name: SK-103, manufactured by Sumitomo Durez). | 6.5 g |
| An ester compound of a novolak resin synthesized from p-t-butylphenol and benzaldehyde with naphthoquinone-(1,2)-diazido-(2)-5-sulfonic acid chloride (condensation degree 50 mole %). | 0.16 g |
| Oil Blue #603 (manufactured by Oriental) | 0.07 g |
| Methyl cellosolve | 100 g |

The coated weight after drying was about 22 mg/dm2.

That is, the positive-type light-sensitive lithographic printing plate prepared in Comparative Example 1 is one that is prepared in the same manner and in the same prescription as in Example 1 except that the two novolak resins (SK-102 and SK-105, 6.5 g in total) used as the binder for the positive-type type light-sensitive lithographic printing plate of Example 1 were replaced by one different novolak resin (SK-103, 6.5 g). If the quantities of all the phenol, m-cresol and p-cresol used in the synthesis of and contained in the above two novolak resins (SK-102 and SK-105, 6.5 g in total) are totaled and the quantity ratio of the three constituents are expressed in molar ratio, the phenol: m-cresol: p-cresol=1/6.5(4.42×20+2.08×50):1/6.5(4.42×48+2.08×30): 1/6.5(4.42×32+2.08×20)=29.6:42.2:28.16, while the molar ratio of the phenol, m-cresol and p-cresol contained in the one novolak resin (SK-103) used in Comparative Example 1 is 30:42:28, which is nearly the same as the above ratio. Accordingly, the only difference between the positive-type light-sensitive lithographic printing plate of Example 1 and the positive-type light-sensitive lithographic printing plate of Comparative Example 1 is deemed due to whether the binder is of the double novolak resin composition or of the single novolak resin composition, in the light of the fact that the respective quantities of the phenol, m-cresol and p-cresol contained in the novolak resins as the binder and the quantity ratio of the three constituents are the same.

The positive-type light-sensitive lithographic printing plate obtained in Comparative Example 1 was imagewise exposed and developed in the same manner as in Example 1 to thereby obtain a lithographic printing plate. And when the sensitivity of it was measured in like manner, the 4¼ step of the foregoing step tablet was found completely developed (cleared), so that a sensitivity nearly the same as that of the lithographic printing plate of Example 1 was obtained.

Subsequently, the positive-type light-sensitive lithographic printing plate obtained in Comparative Example 1 was tested in the same manner as in Example 1 with respect to the processing chemical-resistant characteristic, safety-to-light characteristics and press life. As a result, the lithographic printing plate obtained from the above positive-type light-sensitive lithographic printing plate, when immersed for 45 minutes in the Ultraplate Cleaner liquid, exhibited a corrosion of the image area and only half reproduction of 4% area halftone dots, and, as to the safety-to-light characteristics, exhibited no less than 15% loss of the layer due to the fog by light, thus leading to no less than 35% deterioration of the press life, so that the safety-to-light characteristics were unacceptable.

Thus, regarding the novolak resin as the binder of the positive-type light-sensitive lithographic printing plate, it is understood that the one comprised of two different novolak resins is superior in the safety-to-light characteristics as well as in the processing chemical-resistant characteristic to the one comprised of a single novolak resin, although they have the same sensitivity, even if they are the same in the respective quantities of all the phenol, m-cresol and p-cresol, and the quantity ratio of the three constituents, and even if they are the same in that the quantity ratio of the three constituents falls under the three constituents' quantity ratio range (the region surrounded by the points A, B, C and D) given in FIG. 1.

COMPARATIVE EXAMPLE 2

A positive light-sensitive lithographic printing plate was prepared in the same manner and in the same prescription as in Example 1 except that the two novolak resins (SK-102 and SK-105, 6.5 g in total) used as the binder of the positive-type light-sensitive lithographic printing plate of Example 1 were replaced by the following two novolak resins (6.5 g in total) as the binder.

| | |
|---|---|
| Phenol-m-cresol-p-cresol-formaldehyde co-polycondensate resin (molar ratio of phenol:m-cresol:p-cresol is 40:36:24, number average molecular weight Mn = 1300, weight average molecular weight Mw = 9900, product name: SK-2, manufactured by Sumitomo Durez). | 2 g |
| Phenol-formaldehyde condensate resin (Mn = 1250, Mw = 9200, product name: SK-3, manufactured by Sumitomo Durez). | 4.5 g |

The above molecular weights were determined in the same manner as in Example 1.

The coated weight after drying of the resulting positive-type light-sensiive lithographic printing plate was about 22 mg/dm².

If the quantities of all the phenol, m-cresol and p-cresol used in the synthesis of and contained in the above two novolak resins (SK-2 and SK-3, 6.5 g in total) are totaled, and the quantity ratio of the three constituents are expressed in molar ratio, the ratio of phenol: m-cresol: p-cresol=1/6.5(2×40+4.5×100):1/6.5(2×36): 1/6.5(2×24)=81.5:11.1:7.4, which ratio is out of the three constituents' quantity ratio range (the region surrounded by the points A, B, C and D) shown in FIG. 1 of this invention.

The positive-type light-sensitive lithographic printing plate obtained in Comparative Example 2 was exposed and developed in the same manner as in Example 1 to thereby obtain a lithographic printing plate, and the sensitivity thereof was measured in like manner. As a result, it was found that the foregoing step tablet's 4¾ step was completely developed (cleared), and thus the sensitivity was almost the same as that of the positive-type light-sensitive lithographic printing plate of Example 1.

The positive-type light-sensitive lithographic printing plate obtained in Comparative Example 2 was subsequently tested in the same manner as in Example 1 with respect to the processing chemical-resistant characteristic and safety-to-light characteristics with practical printing operation. As a result, the lithographic printing plate obtained from the above positive-type light-sensitive lithographic printing plate, when immersed for 45 minutes in the Ultraplate Cleaner liquid, was found so remarkably corroded in its image area that the grained surface underneath the light-sensitive layer appears with no reproduction of 5% area halftone dots. As for the safety-to-light characteristics, the printing plate showed no less than 50% loss of the layer due to the fog by light, leading to as large as 75% deterioration of the press life, so that the safety-to-light characteristics were unacceptable. Also, the ink receptivity was so poor that the spoilage was as many as 20 prints.

Thus, it is understood that, even if the binder of the positive-type light-sensitive lithographic printing plate is comprised of two different novolak resins, if the quantity ratio of the three constituents the phenol, m-cresol, and p-cresol is out of the three constituents' quantity ratio range given in FIG. 1, the plate, although the same in the sensitivity, is inferior in the processing chemical-resistant characteristic and safety-to-light characteristics.

COMPARATIVE EXAMPLE 3

A positive-type light-sensitive lithographic printing plate was prepared in the same manner in accordance with the same prescription as in Example 1 except that the two novolak resins (SK-102 and SK-105, 6.5 g in total) used as the binder of the positive-type light-sensitive lithographic printing plate of Example 1 were replaced by the following two novolak resins (6.5 g in total).

| | |
|---|---|
| m-cresol-formaldehyde novolak resin (substantially insoluble in an alkaline solution of not more than pH 12 and having a cloud point of pH 11.3 when measured in accordance with the measuring method as described in Japanese Patent Examined Publication No. 23570/1979). | 5.4 g |
| m-cresol-formaldehyde novolak resin (having a cloud point of pH 10.5 when measured in accordance with the measuring method as described in Japanese Patent Examined Publication No. 23570/1979, that is, it is soluble in an alkaline solution having a pH of not more than 12). | 1.1 g |

The coated weight after drying of the resulting positive-type light-senitive lithographic printing plate was approximately 22 mg/dm².

The positive-type light-sensitive lithographic printing plate obtained in Comparative Example 3 was exposed and developed in the same manner as in Example 1 to thereby obtain a lithographic printing plate, and the sensitivity of it was measured in like manner. As a result, the foregoing step tablet's gray scale step 4¾ was completely developed (cleared), and thus almost the same sensitivity as that of the positive-type light-sensitive lithographic printing plate of Example 1 was obtained.

The positive-type light-sensitive lithographic printing plate obtained in Comparative Example 3 was then tested in the same manner as in Example 1 with respect to the processing chemical-resistant characteristic, safety-to-light characteristics and press life. As a result, the lithographic printing plate obtained from the above positive-type light-sensitive lithographic printing plate, when immersed for 45 minutes in the Ultraplate Cleaner liquid, was so significantly corroded in its image area that the light-sensitive layer in the image area was all dissolved out to make the grained surface of the support bare, thus reproducing no halftone dots, so that the processing chemical-resistant characteristic was very poor. Further, in the safety-to-light characteristics test, the printing plate, when fogged by light, exhibited as much as 70% layer loss, leading to as much as 90% deterioration of the press life, thus showing very inferior safety-to-light characteristics. Also, the ink receptivity was so poor that the spoilage reached as many as 30 prints.

COMPARATIVE EXAMPLE 4

A positive-type light-sensitive lithographic printing plate was prepared in the same manner in accordance with the same prescription as in Example 1 except that the following two novolak resins (6.5 g in total) were used in place of the two novolak resins (SK-102 and SK-105, 6.5 g in total) used as the binder of the positive-type light-sensitive lithographic printing plate prepared in Example 1.

| | |
|---|---|
| Phenol-p-tert-butylphenol-formaldehyde co-polycondensate resin (molar ratio of phenol:p-tert-butylphenol = 50:50, synthesized in accordance with the method as described in Example 1 of Japanese Patent O.P.I. Publication No. 127553/1980). | 3.25 g |
| Phenol-formaldehyde novolak resin (MP-120, manufactured by Gunei Chemical Co., Ltd.). | 3.25 g |

The coated weight after drying of the resulting positive-type light-sensitive lithographic printing plate was approximately 22 mg/dm².

The positive-type light-sensitive lithographic printing plate obtained in Comparative Example 4 was exposed and developed in the same manner as in Example 1 to thereby obtain a lithographic printing plate, and the sensitivity of it was measured in like manner. As a result, the foregoing step tablet's gray scale was developed to be cleared only up to the step 2½ or two clear steps lower in the sensitivity than the positive-type light-sensitive lithographic printing plate of Example 1.

The positive-type light-sensitive lithographic printing plate obtained in Comparative Example 4 was tested in the same manner as in Example 1 with respect to the processing chemical-resistant characteristic, safety-to-light characteristics and press life. As a result, it was found that the above positive-type light-sensitive lithographic printing plate, when immersed for 45 minutes in the Ultraplate Cleaner liquid, showed no corrosion of its image area and exhibited a good processing chemical-resistant characteristic with the reproduction up to 3% area halftone dots. Further, in the safety-to-light characteristics test, the printing plate exhibited 5% layer loss due to the fog by light, leading to 10% deterioration of the press life, thus showing good safety-to-light characteristics. Also, the spoilage was only 10 prints. This positive-type light-sensitive lithographic printing plate, however, is poor in the alkali-solubility; the light-sensitive layer in the non image area is not completely dissolved out to cause the light-sensitive layer to partly remain in the non image area, thus producing scum on the non image background of the printing plate, so that no satisfactory prints were obtained.

The reason is that, in the case where such a co-polycondensate novolak resin comprising a phenol substituted with an alkyl group having not less than three carbon atoms is thus used as part of the binder of the printing plate, the processing chemical-resistant characteristic and safety-to-light characteristics thereof are satisfactory, but the sensitivity thereof is deteriorated, and also the alkali-solubility thereof is poor. Consequently such scum trouble occurs during printing operation.

COMPARATIVE EXAMPLE 5

A positive-type light-sensitive lithographic printing plate was prepared in the same manner as in Example 1 except that the following one novolak resin (6.5 g) was used as the binder in place of the two novolak resins (SK-102 and SK-105, 6.5 g in total) as the binder of the positive-type light-sensitive lithographic printing plate of Example 1.

| | |
|---|---|
| m-cresol-p-cresol-formaldehyde co-polycondensate resin (molar ratio of m-cresol:p-cresol = 50:50, as described in Synthesis Example 1 of the specification of West German OLS Patent No. 2,616,992, number average molecular | 6.5 g |

-continued weight Mn = 1200).

"B" represents a slight corrosion of the image area, and

"C" represents a remarkable corrosion of the image area.

TABLE 1

|  | Sensitivity (number of clear steps) | Safety-to-light | | Processing chemical resistance | Ink receptivity | Scum trouble |
| --- | --- | --- | --- | --- | --- | --- |
|  |  | Layer loss (%) | Deterioration of press life |  |  |  |
| Example 1 (Invention) | 4½ | 5 | 10 | A | 12 | None |
| Comparative example 1 | 4¼ | 15 | 35 | B | 13 | None |
| Comparative example 2 | 4¾ | 50 | 75 | C | 20 | None |
| Comparative example 3 | 4¾ | 70 | 90 | C | 30 | None |
| Comparative example 4 | 2½ | 5 | 10 | A | 10 | Present |
| Comparative example 5 | 3 | 7 | 14 | A | 16 | Present |

The coated weight after drying of the resulting positivetype light-sensitive lithographic printing plate was approximately 22 mg/dm$^2$.

The positive-type light-sensitive lithographic printing plate obtained in Comparative Example 5 was exposed and developed in the same manner as in Example 1 to thereby obtain a lithographic printing plate, and the sensitivity of it was measured in like manner. As a result, the foregoing step tablet's scale was cleared only up to the step 3 or 1½ clear steps lower than in the case of the positive-type light-sensitive lithographic printing plate of Example 1.

This positive-type light-sensitive lithographic printing plate obtained in Comparative Example 5 was subsequently tested in the same manner as in Example 1 with respect to the processing chemical-resistant characteristic, safety-to-light characteristics and press life. As a result, the lithographic printing plate obtained from the above positive-type light-sensitive lithographic printing plate, when immersed for 45 minutes in the Ultraplate Cleaner liquid, exhibited no corrosion of its image area and exhibited a good processing chemical-resistant characteristic with the reproduction of up to 3% area halftone dots. Further, in the safety-to-light characteristics test, the printing plate showed 7% layer loss due to the fog by light, leading to 14% deterioration of the press life, so that the safety-to-light characteristics were good. Also, the ink receptivity was good and the spoilage was 16 prints. However, this positive-type light-sensitive lithographic printing plate is poor in the alkali-solubility as in the case of Comparative Example 4; because the non image area was unable to be developed adequately, scum appeared in the non image area during printing operation, so that no satisfactory prints were obtained.

When the above m-cresol - p-cresol - formaldehyde novolak resin is thus used as the binder, the processing chemical-resistant characteristic and safety-to-light characteristics are good, but the sensitivity is deteriorated and alkali-solubility is poor, so that scum trouble occurs during printing operation.

The results obtained in the examinations of the processing chemical-resistant characteristic, safety-to-light characteristics and press life which were performed in Example 1 and Comparative Examples 1 through 5 are as given in Table 1, wherein "A" represents almost no corrosion of the image area,

EXAMPLE 2

On an aluminum plate support similar to that used in Example 1 was coated and dried the following light-sensitive composition to thereby prepare a positive-type light-sensitive lithographic printing plate.

LIGHT-SENSITIVE COATING LIQUID COMPOSITION

| | |
| --- | --- |
| Ester compound of naphthoquinone-(1,2)-diazido-(2)-5-sulfonic acid chloride with resorcinol-benzaldehyde resin (synthesized in accordance with the method described in Example 1 of the specification of Japanese Patent O.P.I. Publication No. 1044/1981, condensation degree: 50 mole %). | 1.82 g |
| Phenol-m-cresol-p-cresol-formaldehyde co-polycondensate resin (molar ratio of phenol:m-cresol:p-cresol = 50:30:20, weight average molecular weight Mw = 9410, product name: SK-105, manufactured by Sumitomo Durez). | 3.83 g |
| m-cresol-p-cresol-formaldehyde co-polycondensate resin (molar ratio of m-cresol:p-cresol = 60:40, Product name: PSF 2803, manufactured by Gunei Chemical Co., Ltd.). | 2.55 g |
| Ester compound of naphthoquinone-(1,2)-diazido-(2)-5-sulfonic acid chloride with a novolak resin synthesized from p-t-butylphenol and p-octylphenol and formaldehyde (condensation degree: 50 mole %). | 0.16 g |
| Victoria Pure Blue BOH (Hodogaya Chemical Co., Ltd.). | 0.08 g |
| Methyl cellosolve | 100 g |

The coated weight after drying was approximately 22 mg/dm$^2$.

Quantities of all the phenol, m-cresol and p-cresol used in the synthesis of and contained in the two novolak resins (SK-105 and PSF2083, 6.38g in total) were totaled and the quantity ratio of the three constituents were expressed in molar ratio. The molar ratio of the phenol: m-cresol: p-cresol = 30:42:28, which falls under the three constituents' quantity ratio range given in FIG. 1 of this invention.

The positive-type light-sensitive lithographic printing plate of Example 2 was exposed and developed in the same manner as in Example 1 to thereby obtain a lithographic printing plate, and the sensitivity of it was measured in like manner. As a result, the foregoing step tablet's gray scale was developed (cleared) up to the step 5.

Subsequently, the processing chemical-resistant characteristic, safety-to-light characteristics and press life of the printing plate were tested in the same manner as in Example 1. As a result, there was found no corrosion of the image of the printing plate by the Ultraplate Cleaner liquid, and reproduction was made up to 3% area halftone dots, thus showing a good chemical-resistance characteristic. Further, in the safety-to-light characteristics test, the printing plate exhibited 6% layer loss due to the fog by light, leading to 12% deterioration of the press life, thus exhibiting satisfactory safety-to-light characteristics. Also, the ink receptivity during printing operation was good, and the spoilage was only 10 prints. Further no scum trouble occurred and satisfactory prints were obtained.

EXAMPLE 3

On an aluminum plate support similar to that of Example 1 was coated and dried the following light-sensitive coating liquid to obtain a positive-type light-sensitive lithographic printing plate.

LIGHT-SENSITIVE COATING LIQUID COMPOSITION

| | |
|---|---|
| Ester compound of naphthoquinone-(1,2)-diazido-(2)-5-sulfonic acid chloride with m-cresol-formaldehyde novolak resin (condensation degree: 25 mole %). | 3.5 g |
| Phenol-p-cresol-formaldehyde co-polycondensate resin (molar ratio of phenol:p-cresol = 33:67, weight average molecular weight Mw = 12000). | 4.8 g |
| m-cresol-formaldehyde novolak resin (Mw = 2000, SK-4, manufactured by Sumitomo Durez). | 3.2 g |
| Victoria Pure Blue BOH (manufactured by Hodogaya Chemical Co., Ltd.). | 0.2 g |
| Ethyl cellosolve | 100 g |

The coated weight after drying was approximately 22 mg/dm$^2$.

The determination of the above molecular weights was performed in the same manner as in Example 1.

The quantities of all the phenol, m-cresol and p-cresol used in the synthesis of and contained in the above two resins (phenol-p-cresol-formaldehyde resin and SK-4, 8 g in total) were totaled and the quantity ratio of the three constituents was expressed in molar ratio. The molar ratio of the phenol:m-cresol:p-cresol = 19.8:40:40.2, which ratio falls under the three constituents' quantity ratio range given in FIG. 1 of this invention.

The positive-type light-sensitive lithographic printing plate of Example 3 was exposed and developed in the same manner as in Example 1 to obtain a lithographic printing plate, and the sensitivity of it was measured in like manner. As a result, the gray scale was cleared up to the step 4¼. Further, the processing chemical-resistant characteristic, safety-to-light characteristics and press life of the printing plate were tested in the same manner as in Example 1. As a result, the printing plate exhibited 3% layer loss due to the fog by light, leading to 8% deterioration of the press life, thus showing good safety-to-light characteristics. The printing plate also showed satisfactory results in the processing chemical-resistant characteristic and ink receptivity tests.

EXAMPLE 4

A positive-type light-sensitive lithographic printing plate was prepared by coating and drying the following light-sensitive coating liquid on an aluminum plate support similar to that of Example 1.

LIGHT-SENSITIVE COATING LIQUID COMPOSITION

| | |
|---|---|
| Ester compound of naphthoquinone-(1,2)-diazido-(2)-5-sulfonic acid chloride with pyrogallol-acetone resin (synthesized in accordance with the method described in Example 1 of the specification of U.S. Pat. No. 3,635,709, condensation degree: 50 mole %). | 1.39 g |
| Phenol-formaldehyde novolak resin (SK-9, manufactured by Sumitomo Durez). | 1.36 g |
| m-cresol-formaldehyde novolak resin (SK-4, manufactured by Sumitomo Durez). | 2.72 g |
| Phenol-p-cresol-formaldehyde co-polycondensate resin (molar ratio of phenol:p-cresol = 50:50, SK-137, manufactured by Sumitomo Durez). | 2.77 g |
| Oil Blue #603 (manufactured by Oriental) | 0.2 g |
| Methyl cellosolve | 100 g |

The coated weight after drying was approximately 22 mg/dm$^2$.

The quantities of all the phenol, m-cresol and p-cresol used in the synthesis of and contained in the three novolak resins (SK-9, SK-4 and SK-137, 6.81 g in total) were totalled and the quantity ratio of the three constituents were expressed in molar ratio. The molar ratio of the phenol: m-cresol: p-cresol = 1/6.81(1.36×100+2.73×50):1/6.81×2.72×100:1/6.81×2.73×50=40:40:20. which ratio falls under three constituents' quantity ratio range given in FIG. 1 of this invention.

The positive-type light-sensitive lithographic printing plate of Example 4 was exposed and developed in the same manner as in Example 1 to obtain a lithographic printing plate, and the sensitivity of it was measured in like manner. As a result, the gray scale was cleared up to the step 4¾. Further, in the same manner as in Example 1, the processing chemical-resistant characteristic, safety-to-light characteristics and press life of the printing plate were tested. As a result, the printing plate exhibited 7% layer loss, leading to 15% deterioration of the press life, thus showing good safety-to-light characteristics. It also showed satisfactory processing chemical-resistant characteristic and ink receptivity, As is apparent from the results of the above examples, the light-sensitive composition of this invention for positive-type light-sensitive lithographic printing plates, when used in a lithographic printing plate, exhibits highly improved safety-to-light characteristics compared to those of conventional light-sensitive compositions to be applied to lithographic printing plates having similar sensitivity and developability, and also exhibits much improved durability of the image area against processing chemicals for use in printing. Further, it is so excellent in the ink receptivity that the spoilage can be lessened.

EXAMPLE 5

A positive-type light-sensitive lithographic printing plate was prepared in the same manner as in Example 1 except that the following two kinds of novolak resins of 6.5 % g in total were used as the binders in place of the two novolak resins (SK-102 and SK-105%, 6.5 g in total) used as the binders of the positive-type light-sensitive lithographic printing plate prepared in Example 1:

| | |
|---|---|
| phenol-formaldehyde condensation resin (the number average molecular weight Mn was 450, and the weight average molecular weight MW was 1680) | 2.4 g |
| m-cresol-p-cresol-formaldehyde co-polycondensation resin (the molar ratio of m-cresol to p-cresol was 60 to 40, the number average molecular weight Mn was 380 and the weight average molecular weight Mw was 1450) | 4.1 g |

Each of the above-mentioned molecular weight was measured in the same manner as in Example 1.

The coated weight of the resulted positive-type light-sensitive lithographic printing plate was approximately 22 mg/dm$^2$ after drying.

Quantities of all the phenol, m-cresol and p-cresol used in the synthesis of and contained in the above-mentioned two novolak resins were totaled and the quantity ratio of the three constituents was expressed in molar ratio. The molar ratio of the phenol: m-cresol: p-cresol was 36.9:37.9:25.2, which falls under the range of the three constituents' quantity ratio given in FIG. 1 of the invention.

The sensitivity, processing chemical resistance, safety-to-light characteristics and press-life of the positive-type light-sensitive lithographic printing plate prepared in Example 5 were tested in the same manner as in Example 1. As the result, the sensitivity was so high that the foregoing step tablet's gray scale was completely developed (cleared) up to the step 5 and there was few corrosion of the image areas of the printing plate graded B in Table 1 when an ultraplate cleaner was applied, and in the safety-to-light test, the printing plate exhibited 10% layer less due to the fog by light, leading to 25% deterioration of the press life, thus exhibiting relatively satisfactory safety-to-light characteristics. Also, the ink receptivity in printing operation was good, and the paper spoilage was only 12 prints. Further, no scum trouble occurred in printing operation and satisfactory printed matters were obtained.

What is claimed is:

1. A light-sensitive composition for positive-type light-sensitive lithographic printing plates comprising an admixture of a light-sensitive o-quinonediazide compound present in an amount of from 30 to 95% by weight of said light-sensitive composition and a novolak resin present in an amount of from 5 to 60% by weight of the total solid components of said light-sensitive composition, wherein
said novolak resin comprises at least two different novolak resins, said novolak resins each being a resin obtained by the polycondensation or co-polycondensation of an aldehyde with at least one compound selected from the group consisting of phenol, m-cresol, o-cresol and p-cresol, and the ratios in mole percentages of the respective sums of the quantities of said phenol, the quantities of one or both of said m-cresol and the quantities of said p-cresol, which are constituents for the polycondensation or co-polycondensation of each said novolak resin contained in said light-sensitive composition, to the total of the quantities of all said constituents are from 5 to 75 mole % for said phenol, from 20 to 70 mole % for one or both of said m-cresol and said o-cresol and from 5 to 75 mole % for said p-cresol.

2. The light-sensitive composition for positive-type light-sensitive lithographic printing plates of claim 1, wherein said ratios in mole percentages of said respective sums of the quantities of said phenol, the quantities of one or both of said m-cresol and said o-cresol and the quantities of said p-cresol in said novolak resins to the total of the quantities of all these constituents are from 10 to 65 mole % for said phenol, from 30 to 55 mole % for one or both of said m-cresol and said o-cresol and from 5 to 40 mole % for said p-cresol.

3. The light-sensitive composition for positive-type light-sensitive lithographic printing plates of claim 1, wherein said novolak resin comprises in combination of phenol-m-cresol-p-cresol-formaldehyde co-polycondensates which are different in the property or in combination of a phenol-m-cresol-p-cresol-formaldehyde co-polycondensate with a m-cresol-p-cresol-formaldehyde co-polycondensate.

4. The light-sensitive composition for positive-type light-sensitive lithographic printing plates of claim 1, wherein said novolak resin has a number average molecular weight Mn of from $3 \times 10^2$ to $5 \times 10^3$ and a weight average molecular weight Mw of from $1 \times 10^3$ to $2 \times 10^4$.

5. The light-sensitive composition for positive-type light-sensitive lithographic printing plates of claim 1, wherein said novolak resin has a number average molecular weight Mn of from $1 \times 10^3$ to $3 \times 10^3$ and a weight average molecular weight Mw of from $6 \times 10^3$ to $1.5 \times 10^4$.

6. The light-sensitive composition for positive-type light-sensitive lithographic printing plates of claim 1, wherein said novolak resin content of said light-sensitive composition accounts for 50 to 85% by weight of said light-sensitive composition.

7. The light-sensitive composition for positive-type light-sensitive lithographic printing plates of claim 1, wherein said o-quinonediazide compound content of said light-sensitive composition accounts for 10 to 50% by weight of the whole solid of said light-sensitive composition.

8. The light-sensitive composition for positive-type light-sensitive lithographic printing plates of claim 1, wherein said light-sensitive composition comprises further an ink-receptivity-improving agent which accounts for 0.1 to 2% by weight of said light-sensitive composition.

* * * * *